United States Patent

Bourge et al.

(10) Patent No.: US 11,184,555 B2
(45) Date of Patent: Nov. 23, 2021

(54) IMAGE CAPTURE METHOD ADAPTED TO FLICKERING LIGHT SOURCES AND IMAGE SENSOR

(71) Applicants: STMicroelectronics SA, Montrouge (FR); STMicroelectronics (Grenoble 2) SAS, Grenoble (FR)

(72) Inventors: Arnaud Bourge, Paris (FR); Tarek Lule, Saint-Egreve (FR); Gregory Roffet, Coublevie (FR)

(73) Assignees: STMICROELECTRONICS (GRENOBLE 2) SAS, Grenoble (FR); STMICROELECTRONICS SA, Montrouge (FR)

( * ) Notice: Subject to any disclaimer, the term of this patent is extended or adjusted under 35 U.S.C. 154(b) by 94 days.

(21) Appl. No.: 16/692,638

(22) Filed: Nov. 22, 2019

(65) Prior Publication Data

US 2020/0195832 A1 Jun. 18, 2020

(30) Foreign Application Priority Data

Dec. 12, 2018 (FR) ..................................... 1872787

(51) Int. Cl.
*H04N 5/235* (2006.01)
*H04N 5/355* (2011.01)
*H04N 5/353* (2011.01)
*H01L 27/146* (2006.01)

(52) U.S. Cl.
CPC ......... *H04N 5/2357* (2013.01); *H04N 5/2355* (2013.01); *H04N 5/353* (2013.01); *H04N 5/35581* (2013.01); *H01L 27/14645* (2013.01)

(58) Field of Classification Search
CPC .. H04N 5/2357; H04N 5/353; H04N 5/35581; H04N 5/243; H04N 5/2358; H01L 27/14645

See application file for complete search history.

(56) References Cited

U.S. PATENT DOCUMENTS

| | | | |
|---|---|---|---|
| 2004/0016919 A1* | 1/2004 | Daiku | H04N 5/235 257/14 |
| 2005/0264682 A1 | 12/2005 | Kurane | |
| 2014/0078358 A1* | 3/2014 | Takenaka | H04N 5/2353 348/294 |
| 2018/0160062 A1 | 6/2018 | Shigeta et al. | |
| 2019/0124278 A1 | 4/2019 | Velichko | |

FOREIGN PATENT DOCUMENTS

DE 202018105975 U1 11/2018

* cited by examiner

*Primary Examiner* — Nelson D. Hernández Hernández
(74) *Attorney, Agent, or Firm* — Slater Matsil, LLP

(57) ABSTRACT

An image sensor includes a plurality of pixels, where each of the plurality of pixels includes a photodiode. The image sensor is configured to capture images of a scene exposed with a flickering light source by for each of the plurality of pixels, acquiring a value representative of a light level at a corresponding pixel by gradually varying a value of sensitivity of the corresponding pixel.

17 Claims, 2 Drawing Sheets

IMAGE CAPTURE METHOD ADAPTED TO FLICKERING LIGHT SOURCES AND IMAGE SENSOR

CROSS-REFERENCE TO RELATED APPLICATIONS

This application claims priority to French Patent Application No. 1872787, filed on Dec. 12, 2018, which application is hereby incorporated herein by reference.

TECHNICAL FIELD

Embodiments and implementations of the invention relate to imaging, and more particularly to an image capture method adapted to flickering light sources and image sensor.

BACKGROUND

An image sensor conventionally includes a matrix array of pixels each including a photodiode and a control circuit that is suitable for delivering an output signal representative of the light level received by its photodiode. Such a sensor allows a discretized and digitized image of a scene (or digital image) to be acquired. Such a sensor can however discriminate only a finite number of light levels received by each photodiode. It is therefore not always possible to capture the entirety of the light range available in a scene.

One problem that arises is that certain scenes include flashing light sources, for example lights or traffic lights employing pulsed LEDs (LED being the acronym of light-emitting diode). These light sources turn on and turn off at relatively high frequencies, typically about 50 Hz to 2 kHz, with turn-on duty cycles (period turned on over period turned off) that may be quite low, for example about 0.05 to 0.5.

In many situations, there is a risk that the light emitted by such sources will not be detected or will be incorrectly detected by the sensor. The acquired scene has a high contrast and contains horizontal black strips characteristic of flickering effect.

This problem arises most particularly in the field of on-board image sensors integrated into motor vehicles with a view to analyzing the environment of the vehicles. These environments are liable to contain flashing light sources.

To decrease flickering effect, one solution consists in adjusting the exposure period to a multiple of the period of the LED.

By "exposure period", also called exposure time, what is meant is the time interval between the first and second time of acquisition, by the sensor, of the light emitted by a light source, for each pixel.

However, pulsed light-emitting diodes do not have a standardized and set frequency. It may typically vary from 80 Hz to 500 Hz, this therefore making the adjustment difficult to realize.

There is therefore a need to provide a new method for acquiring said output signal representative of the light level received by the photodiode, not based on knowledge or detection of the frequency of the LED.

SUMMARY

According to embodiments and implementations, it is proposed to meet this need with a solution that is simple to implement, based on a gradual variation in the value of the sensitivity of the photodiode.

By "sensitivity of the photodiode", what is meant is the number of electrons that the photodiode generates per incident photon.

By "gradual variation", what is for example meant is a stepwise variation.

According to one aspect, a method is provided for capturing images of a scene with pixels of a sensor in the presence of a flickering light source, said method comprising for each pixel an acquisition of a value representative of the light level to which at least one photodiode of the pixel is exposed, said acquisition comprising at least one gradual variation in the value of the sensitivity of said at least one photodiode.

The gradual variation in the value of the sensitivity of said at least one photodiode allows the light to be gradually integrated thus decreasing flickering effect. This allows the difference between the light intensities integrated by the pixels to be attenuated.

According to one implementation, said at least one gradual variation comprises: a gradual increase in the value of the sensitivity of said at least one photodiode until a threshold value is reached and, a gradual decrease in the value of the sensitivity of said at least one photodiode from said threshold value.

The gradual increase and decrease in the value of the sensitivity of said at least one photodiode allow a continuous transition effect to be created considerably attenuating flickering effect.

According to one implementation, the method furthermore comprises a stabilization of the value of the sensitivity of said at least one photodiode at said threshold value after said gradual increase and before said gradual decrease.

The stabilization of the value of the sensitivity may possibly be an optional step.

According to one implementation, the method furthermore comprises an adjustment of the duration of said at least one gradual variation in the value of the sensitivity of said at least one photodiode.

Said duration is strictly longer than o and may reach half the exposure period of said at least one photodiode.

According to one implementation, said acquisition being carried out during an integration period divided into a plurality of separate sub-periods, said at least one gradual variation comprises at least one gradual variation in the duration between each sub-period.

The "integration period" allows during a given duration said value representative of the light level to which said at least one photodiode is exposed to be acquired.

The variation in the value of the sensitivity of said at least one photodiode depends on the variation in the duration between each sub-period.

The principle and the advantages of the separate sub-periods are described in the French patent application published under No. 3042912.

According to one implementation, the method furthermore comprises a gradual adjustment in the duration of each sub-period.

By increasing the duration of each sub-period, the value of the sensitivity of said at least one photodiode is increased. Reciprocally, by decreasing the duration of each sub-period, the value of the sensitivity of said at least one photodiode is decreased.

The duration of each sub-period is adjustable within the technological limits of the pixel. It may for example be between 5 µs and 160 µs.

According to one implementation, said at least one gradual variation in the duration between each sub-period comprises: a gradual decrease in the duration between each sub-period in order to gradually increase the value of the sensitivity of said at least one photodiode; a gradual increase in the duration between each sub-period in order to gradually decrease the value of the sensitivity of said at least one photodiode.

In other words, to create said continuous transition effect, the duration between each sub-period must gradually decrease to bring the sub-periods closer together and thus make the value of the sensitivity of said at least one photodiode increase. Reciprocally, the duration between each sub-period must then gradually increase in order to move the sub-periods further apart and thus make the value of the sensitivity of said at least one photodiode decrease.

According to one implementation, the method furthermore comprises an adjustment of the exposure period depending on the frequency of said flickering light source.

Said adjustment is realized depending on the frequency of said light source, which is known or estimated.

By adjusting the exposure period, the image sensor is more robust and more tolerant to errors, to deviations between the estimated or known frequency of said light source and the real frequency of the source for example.

According to another aspect, an image sensor configured to capture images of a scene is provided, said image sensor comprising pixels each including at least one photodiode, and acquiring means that are configured to acquire, for each pixel, in the presence of a flickering light source, a value representative of the light level to which at least one photodiode is exposed, said acquiring means comprising control means that are configured to realize at least one gradual variation in the value of the sensitivity of said at least one photodiode.

According to one embodiment, the control means are configured to: gradually increase the value of the sensitivity of said at least one photodiode until a threshold value is reached and, gradually decrease the value of the sensitivity of said at least one photodiode from said threshold value.

According to one embodiment, the control means are furthermore configured to stabilize the value of the sensitivity of said at least one photodiode to said threshold value after said gradual increase and before said gradual decrease.

According to one embodiment, the control means are furthermore configured to adjust the duration of said at least one gradual variation in the value of the sensitivity of said at least one photodiode.

According to one embodiment, the acquiring means are configured to acquire said representative value during an integration period that is divided into a plurality of separate sub-periods, and wherein the control means that are configured to realize at least one gradual variation in the value of the sensitivity of said at least one photodiode are also configured to realize a gradual variation in the duration between each sub-period.

According to one embodiment, the control means are furthermore configured to gradually adjust the duration of each sub-period.

By increasing the duration of each sub-period, the value of the sensitivity of said at least one photodiode is increased. Reciprocally, by decreasing the duration of each sub-period, the value of the sensitivity of said at least one photodiode is decreased.

According to one embodiment, the control means are configured to: gradually decrease the duration between each sub-period during the gradual increase in the value of the sensitivity of said at least one photodiode; gradually increase the duration between each sub-period during the gradual decrease in the value of the sensitivity of said at least one photodiode.

According to one embodiment, the control means are configured to adjust an exposure period depending on the frequency of said flickering light source.

BRIEF DESCRIPTION OF THE DRAWINGS

Other advantages and features of the invention will become apparent on examining the detailed description of completely non-limiting implementations and embodiments of the invention, and the appended drawings in which.

DETAILED DESCRIPTION OF ILLUSTRATIVE EMBODIMENTS

Figure 1:
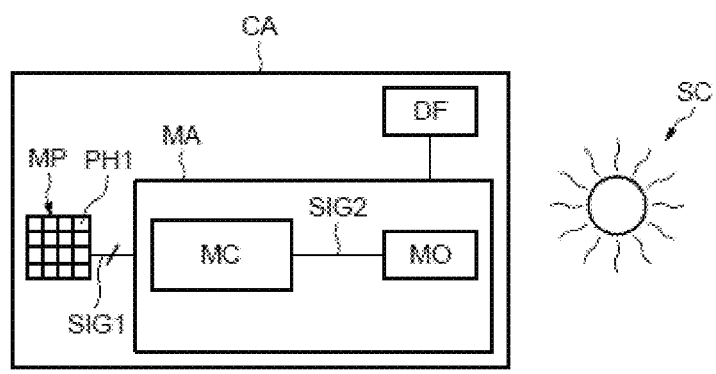
FIG. 1 schematically illustrates one embodiment and implementation of the invention.

FIG. 1 schematically illustrates an example of an image sensor CA configured to capture images of a scene illuminated by a flickering light source SC.

The image sensor CA comprises a matrix array of pixels in which each pixel includes at least one photodiode PH1 that is configured to transmit to acquiring means MA a value representative of its light level via a signal SIG1.

In other words, each photodiode, in the presence of the light source SC converts the radiation received from the flickering light source SC into a signal SIG1 corresponding to said value representative of the light level to which said at least one photodiode PH1 is exposed.

The acquiring means MA are, in this example, coupled to a frequency detector DF that is configured to acquire the frequency of said flickering light FC, which is for example a pulsed light-emitting diode (LED).

Said acquiring means MA comprise control means MC that are coupled to a module MO and configured to transmit control signals SIG2 to said module MO, which is configured to gradually decrease, gradually increase or stabilize the sensitivity of said at least one photodiode PH1 with the aim of obtaining a continuous transition effect that considerably attenuates the flickering effect produced by said light SC. To do this, the principle allowing said effect to be approached has been illustrated in FIG. 2.

Figure 2:
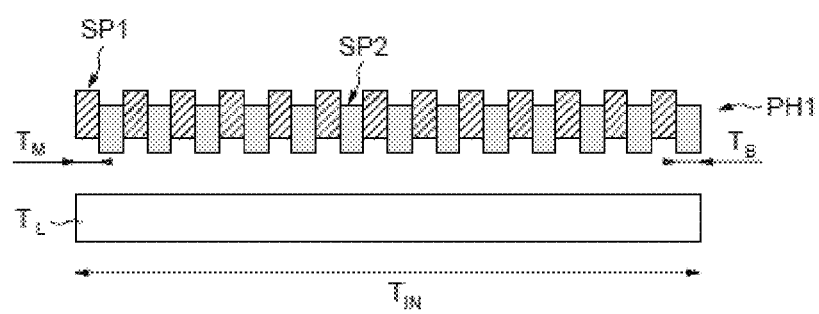
FIG. 2 schematically illustrates one embodiment and implementation of the invention.

In FIG. 2, the reference TIN designates one exposure period.

By "exposure period" what is meant is the time interval between the start and end of the period TL of integration of the light for a pixel or a set of pixels. Said integration period TL may be continuous or discontinuous as described in the French patent application published under No. 3042912.

Said exposure period TIN is divided into a plurality of first separate exposure sub-periods SP1 having a duration TM and separated by second separate exposure sub-periods SP2 having a duration TB.

In other words, each first sub-period SP1 is separated by a second sub-period SP2.

At the end of a first exposure sub-period SP1, a first value representative of the light level to which said at least one photodiode PH1 is exposed is read and stored in memory, and said at least one photodiode PH1 is reset during the duration TB of the second sub-period SP2 before the start of another first exposure sub-period SP1.

At the end of this exposure sub-period SP1, the value representative of the light level to which said at least one photodiode PH1 is exposed is read and added to the value of the exposure sub-period SP1 stored beforehand.

This process is repeated for each first exposure sub-period SP1.

At the end of the last first exposure sub-period SP1, the value accumulated over all the first sub-periods SP1 represents the light level to which said at least one photodiode PH1 was exposed in this cumulative time. It will be transmitted to the acquiring means MA.

The durations TM of the first sub-periods SP1 and the durations TB of the second sub-periods SP2 may vary from one exposure period to the next depending on the ambient light level, it being understood that the sum of the durations TM and TB of the first and second sub-periods SP1 and SP2 is always shorter than or equal to the duration of the exposure period TIN, which is generally constant. It may also be varied using, for example, an automatic exposure algorithm known to those skilled in the art.

Thus, the longer the durations TB of the second sub-periods SP2, the more the durations TM of the first sub-periods SP1 are spaced apart and therefore of low density. Reciprocally, the shorter the durations TB of the second sub-periods SP2, the closer together the durations TM of the first sub-periods SP1, this being representative of a high density.

The durations TM of the first sub-periods SP1 may be set or adjustable. It is possible for example to gradually increase then decrease density by gradually increasing then decreasing the durations TM. In this case, the durations TB are therefore also adjusted in order to obtain the profile of the desired density variation.

If density gradually increases, the value of the sensitivity of the photodiode PH1 also gradually increases. In contrast, if density gradually decreases, the value of the sensitivity of the photodiode PH1 also gradually decreases.

The gradual increase and decrease in the value of the sensitivity of the photodiode allows said continuous transition effect to be created and thus flickering effect to be considerably attenuated.

Figure 3:
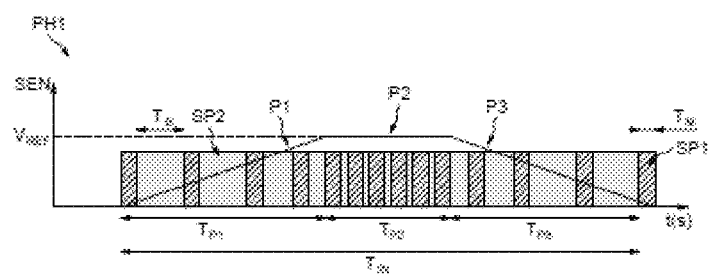
FIG. 3 schematically illustrates one embodiment and implementation of the invention.

FIG. 3 schematically illustrates the variation in the value of the sensitivity SEN of the photodiode PH1 as a function of time t in seconds s, on the exposure period TIN.

Three steps may be seen. A first step P1 in which the value of the sensitivity SEN gradually increases during a duration TP1 to reach a threshold value VREF.

The threshold value VREF is for example 100%.

The increase in said sensitivity SEN is characterized by a gradual decrease in the duration TB of the second sub-periods SP2 and therefore by the gradual increase in the density of the first sub-periods SP1.

A second step P2 is also illustrated in said figure, in which the value of the sensitivity SEN, after having reached said threshold VREF remains stable during a defined duration TP2.

The second step P2 is followed by a third step P3 in which the value of the sensitivity SEN gradually decreases during a duration TP3 from the threshold value VREF to the end of the exposure period TIN.

The decrease in said sensitivity SEN is characterized by a gradual increase in the duration TB of the second sub-periods SP2 and therefore by the gradual decrease in the density of the sub-periods SP1.

Thus, these three steps P1, P2 and P3 allow, as mentioned above, a continuous transition effect that considerably attenuates flickering effect to be created.

Thus, in the first step P1, the control means MC transmit said signal SIG2 to said module MO so that it decreases the duration TB of the second sub-periods SP2 and therefore increases the density of the first sub-periods SP1.

In the second step P2, the control means MC transmit said signal SIG2 to said module MO so that it stabilizes the duration TB of the second sub-periods SP2 and therefore does not make the density of the first sub-periods SP1 vary.

In the third step P3, the control means MC transmit said signal SIG2 to said module MO so that it increases the duration TB of the second sub-periods SP2 and therefore decreases the density of the first sub-periods SP1.

It is also possible to obtain said continuous transition effect without the second step P2, only the first step P1 and the third step P3 being retained.

Figure 4:
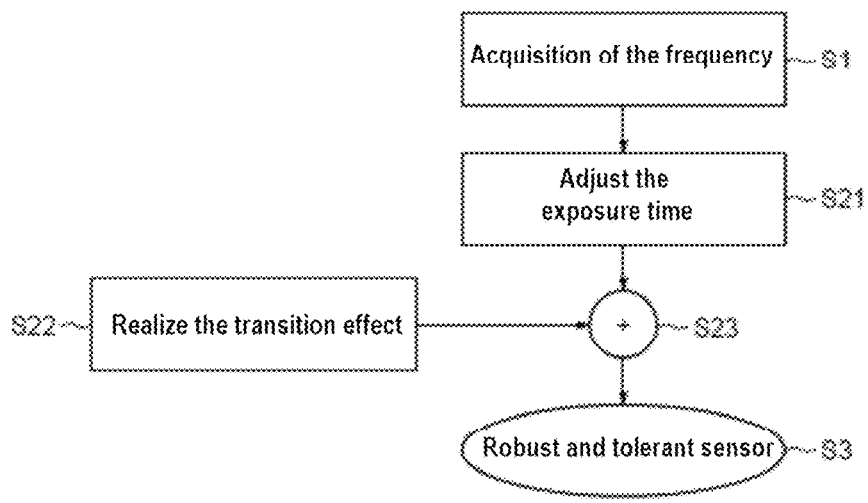
FIG. 4 schematically illustrates one embodiment and implementation of the invention.

FIG. 4 illustrates one implementation of the invention allowing the robustness and tolerance of the sensor CA to be improved.

In step S1, the frequency detector DF acquires the frequency of said flickering light SC and is configured to adjust the exposure time TIN to a multiple of the period of said flickering light SC in step S21.

In parallel, in step S22, said module MO gradually decreases, stabilizes and gradually increases the sensitivity of said at least one photodiode PH1 with the aim of realizing said effect.

Steps S21 and S22 are combined in step S23 in order to improve in step S3 the robustness and tolerance of the sensor CA to errors caused by the nature of the flickering light source SC.

From a hardware point of view, the control means MC and the module MO may take the form of software modules or of a hardware architecture within a microcontroller. As for the frequency detector DF, it has a conventional structure that is known per se.

Moreover, it is possible to associate, with the photodiode PH1 of each pixel, at least one other photodiode the integration period of which is not divided into separate sub-periods, this making it possible to guarantee, in case of flicker, that the pixel will perform satisfactorily under low light levels.

What is claimed is:

1. A method for capturing images of a scene, the method comprising:
   exposing a sensor comprising a plurality of pixels to a flickering light source; and
   for each of the plurality of pixels, acquiring a value representative of a light level at a corresponding pixel by
   gradually varying a value of sensitivity of the corresponding pixel, wherein acquiring the value representative of the light level is carried out during an integration period divided into a plurality of separate sub-periods, and wherein gradually varying the value of sensitivity of the corresponding pixel comprises gradually varying a duration between each sub-period of the plurality of separate sub-periods.

2. The method according to claim 1, wherein gradually varying the value of sensitivity comprises:
   gradually increasing the value of the sensitivity of a corresponding photodiode of the corresponding pixel until a threshold value is reached; and
   gradually decreasing the value of the sensitivity of the corresponding photodiode from the threshold value.

3. The method according to claim 2, further comprising:
for each of the plurality of pixels, maintaining the value of the sensitivity of the corresponding photodiode at the threshold value after the gradual increase and before the gradual decrease.

4. The method according to claim 1, further comprising:
for each of the plurality of pixels, adjusting a duration over which the value of sensitivity of the corresponding pixel is gradually varied.

5. The method according to claim 1,
wherein gradually varying the value of sensitivity comprises:
gradually increasing the value of the sensitivity of a corresponding photodiode of the corresponding pixel until a threshold value is reached, and
gradually decreasing the value of the sensitivity of the corresponding photodiode from the threshold value; and
wherein gradually varying the value of sensitivity of the corresponding pixel comprises:
gradually decreasing a duration between each sub-period of the plurality of separate sub-periods when gradually increasing the value of the sensitivity of the corresponding photodiode, and
gradually increasing the duration between each sub-period of the plurality of separate sub-periods when gradually decreasing the value of the sensitivity of the corresponding photodiode.

6. The method according to claim 1, further comprising adjusting an exposure period depending on a frequency of the flickering light source.

7. An image sensor comprising:
a plurality of pixels, each of the plurality of pixels including a photodiode, wherein the image sensor is configured to capture images of a scene exposed with a flickering light source by:
for each of the plurality of pixels, acquiring a value representative of a light level at a corresponding pixel by gradually varying a value of sensitivity of the corresponding pixel, wherein acquiring the value representative of the light level is carried out during an integration period divided into a plurality of separate sub-periods, and wherein gradually varying the value of sensitivity of the corresponding pixel comprises gradually varying a duration between each sub-period of the plurality of separate sub-periods.

8. The sensor according to claim 7, further comprising a frequency detector to determine a frequency of the flickering light source.

9. The sensor according to claim 8, wherein the sensor is configured to adjust an exposure period depending on the frequency of the flickering light source.

10. The sensor according to claim 7, wherein the sensor is configured to gradually vary the value of sensitivity by:
gradually increasing the value of the sensitivity of a corresponding photodiode of the corresponding pixel until a threshold value is reached; and
gradually decreasing the value of the sensitivity of the corresponding photodiode from the threshold value.

11. The sensor according to claim 10, wherein the sensor is further configured to:
for each of the plurality of pixels, maintain the value of the sensitivity of the corresponding photodiode at the threshold value after the gradual increase and before the gradual decrease.

12. The sensor according to claim 7, wherein the sensor is further configured to:
for each of the plurality of pixels, adjust a duration over which the value of sensitivity of the corresponding pixel is gradually varied.

13. The sensor according to claim 7, wherein the sensor is configured to acquire the value representative of the light level during an integration period divided into a plurality of separate sub-periods.

14. The sensor according to claim 13, wherein the sensor is configured to gradually vary the value of sensitivity of the corresponding pixel by gradually varying a duration between each sub-period of the plurality of separate sub-periods.

15. The sensor according to claim 7,
wherein the sensor is further configured to gradually vary the value of sensitivity by:
gradually increasing the value of the sensitivity of a corresponding photodiode of the corresponding pixel until a threshold value is reached, and
gradually decreasing the value of the sensitivity of the corresponding photodiode from the threshold value; and
wherein the sensor is further configured to gradually vary the value of sensitivity of the corresponding pixel by:
gradually decreasing a duration between each sub-period of the plurality of separate sub-periods when gradually increasing the value of the sensitivity of the corresponding photodiode, and
gradually increasing the duration between each sub-period of the plurality of separate sub-periods when gradually decreasing the value of the sensitivity of the corresponding photodiode.

16. An image sensor comprising:
a plurality of pixels, each of the plurality of pixels including a photodiode; and
a frequency detector to determine a frequency of a flickering light source, wherein the image sensor is configured to capture images of a scene exposed with the flickering light source by:
for each of the plurality of pixels, acquiring, during an integration period divided into a plurality of separate sub-periods, a value representative of a light level at a corresponding pixel by
gradually increasing a value of sensitivity of a corresponding photodiode of the corresponding pixel to a first value,
maintaining the value of sensitivity of the corresponding photodiode at the first value after the gradual increase, and
gradually decreasing the value of sensitivity of the corresponding photodiode from the first value to a second value, wherein the sensor is further configured to gradually increase the value of sensitivity of the corresponding pixel by gradually decreasing a duration between each sub-period of the plurality of separate sub-periods, and gradually decrease the value of sensitivity of the corresponding pixel by gradually increasing the duration between each sub-period of the plurality of separate sub-periods.

17. The sensor according to claim 16, wherein the sensor is configured to adjust an exposure period depending on the frequency of the flickering light source.

* * * * *